US012664344B2

(12) United States Patent
Narisetty et al.

(10) Patent No.: US 12,664,344 B2
(45) Date of Patent: Jun. 23, 2026

(54) STRUCTURE INCLUDING PASSIVE COMPONENT TRAVERSING MULTIPLE SEMICONDUCTOR CHIPS, WITH RELATED METHODS AND SYSTEMS

(71) Applicant: GlobalFoundries U.S. Inc., Malta, NY (US)

(72) Inventors: Haritez Narisetty, Fremont, CA (US); Manubhai Patel Jignesh, Milpitas, CA (US); Ching Theng Lew, Singapore (SG); Ananth Sundaram, Bangalore (IN); Muhammed Shafi Kunnathodi, Malappuram (IN); Praveen Paul Arotha, Bangalore (IN); Varuna AnanthaPadmanabha Baipadi, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 483 days.

(21) Appl. No.: 18/311,712

(22) Filed: May 3, 2023

(65) Prior Publication Data
US 2024/0371809 A1 Nov. 7, 2024

(51) Int. Cl.
*G06F 30/39* (2020.01)
*H10W 46/00* (2026.01)
*H10W 90/00* (2026.01)

(52) U.S. Cl.
CPC ............ *G06F 30/39* (2020.01); *H10W 46/00* (2026.01); *H10W 90/00* (2026.01); *H10W 46/301* (2026.01); *H10W 90/792* (2026.01)

(58) Field of Classification Search
CPC ................. H01L 24/08; H01L 25/0657; H01L 2224/08145; H01L 2225/06513; H01L 23/544; H01L 2223/54426; H01L 2924/1903; H01L 2924/19041; H01L 2924/19042; H01L 2924/19043; H01L 2924/19104; H01L 25/50; H01L 2225/06541; G06F 30/39
See application file for complete search history.

(56) References Cited

U.S. PATENT DOCUMENTS

| | | | |
|---|---|---|---|
| 8,060,843 B2 | 11/2011 | Wang et al. | |
| 8,136,071 B2 | 3/2012 | Solomon | |
| 8,629,553 B2 | 1/2014 | Farooq et al. | |
| 8,650,516 B2 | 2/2014 | McIlrath | |
| 9,064,077 B2 | 6/2015 | Samadi et al. | |
| 9,564,432 B2 | 2/2017 | Or-Bach et al. | |
| 11,239,205 B2 * | 2/2022 | Hu | H01L 24/20 |
| 2007/0296073 A1 | 12/2007 | Wu et al. | |
| 2009/0070727 A1 | 3/2009 | Solomon | |

(Continued)

*Primary Examiner* — Mamadou L Diallo

(74) *Attorney, Agent, or Firm* — David Cain; Hoffman Warnick LLC

(57) ABSTRACT

Embodiments of the disclosure provide a structure including a passive component traversing multiple semiconductor chips, with related systems and methods. A structure of the disclosure includes a plurality of stacked semiconductor chips including a first chip coupled to a second chip through an interface. A passive component traverses the interface between the first chip and the second chip of the plurality of stacked semiconductor chips. The passive component includes a first portion within the first chip and a second portion within the second chip.

20 Claims, 9 Drawing Sheets

(56)                    References Cited

U.S. PATENT DOCUMENTS

| | | | |
|---|---|---|---|
| 2015/0076710 A1* | 3/2015 | Chang | H01L 25/50 |
| | | | 257/774 |
| 2018/0158749 A1* | 6/2018 | Yu | H01L 25/18 |
| 2019/0355707 A1* | 11/2019 | Lee | H01L 24/97 |
| 2021/0175199 A1* | 6/2021 | Song | H01L 25/50 |
| 2022/0084936 A1* | 3/2022 | Qian | H01L 23/528 |
| 2023/0066372 A1* | 3/2023 | Chang | H01L 23/5223 |
| 2023/0069315 A1* | 3/2023 | Chang | H01L 24/33 |
| 2024/0088035 A1* | 3/2024 | Sharma | H01L 21/76807 |
| 2024/0201435 A1* | 6/2024 | Cheng | G02B 6/1223 |
| 2024/0421128 A1* | 12/2024 | Sun | H10D 1/692 |
| 2025/0096053 A1* | 3/2025 | Ecton | H01L 23/5226 |

* cited by examiner

STRUCTURE INCLUDING PASSIVE COMPONENT TRAVERSING MULTIPLE SEMICONDUCTOR CHIPS, WITH RELATED METHODS AND SYSTEMS

BACKGROUND

1. Technical Field

The present disclosure provides a method and system to fabricate a passive component traversing multiple semiconductor chips.

2. Background Art

Devices having integrated circuits (ICs) therein have not grown larger in proportion with the amount of circuitry and functions needed to implement desired features. Over time, the surface area needed to implement various types of circuitry has become a more significant obstacle to implementing all desired features of an IC. One approach for mitigating such concerns is to form a device structure on multiple IC chips and connect the IC chips together to form a single product. However, the effectiveness of this approach remains limited due to certain components still occupying large amounts of surface area within a single IC chip.

SUMMARY

The illustrative aspects of the present disclosure are designed to solve the problems herein described and/or other problems not discussed.

Embodiments of the disclosure provide a structure including: a plurality of stacked semiconductor chips including a first chip coupled to a second chip through an interface; and a passive component traversing the interface between the first chip and the second chip of the plurality of stacked semiconductor chips, wherein the passive component includes a first portion within the first chip and a second portion within the second chip.

Other embodiments of the disclosure provide a method including: generating a three-dimensional model of a passive component traversing a plurality of stacked semiconductor chips, wherein the three-dimensional model includes: a first portion of the passive component in a first chip, the first portion including all ports for the passive component and being configured to simulate electrical operation of the passive component as part of the first chip, and a second portion of the passive component in a second chip, wherein the second portion does not include any ports for the passive component; and fabricating the passive component based on the three-dimensional model.

Additional embodiments of the disclosure provide a system including: a computing device configured to generate a three-dimensional model of a passive component traversing a plurality of stacked semiconductor chips, wherein the three-dimensional model includes: a first portion of the passive component in a first chip, the first portion including all ports for the passive component and being configured to simulate electrical operation of the passive component as part of the first chip, and a second portion of the passive component in a second chip, wherein the second portion does not include any ports for the passive component; and a manufacturing device in communication with the computing device and configured to fabricate the passive component based on the three-dimensional model.

Two or more aspects described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
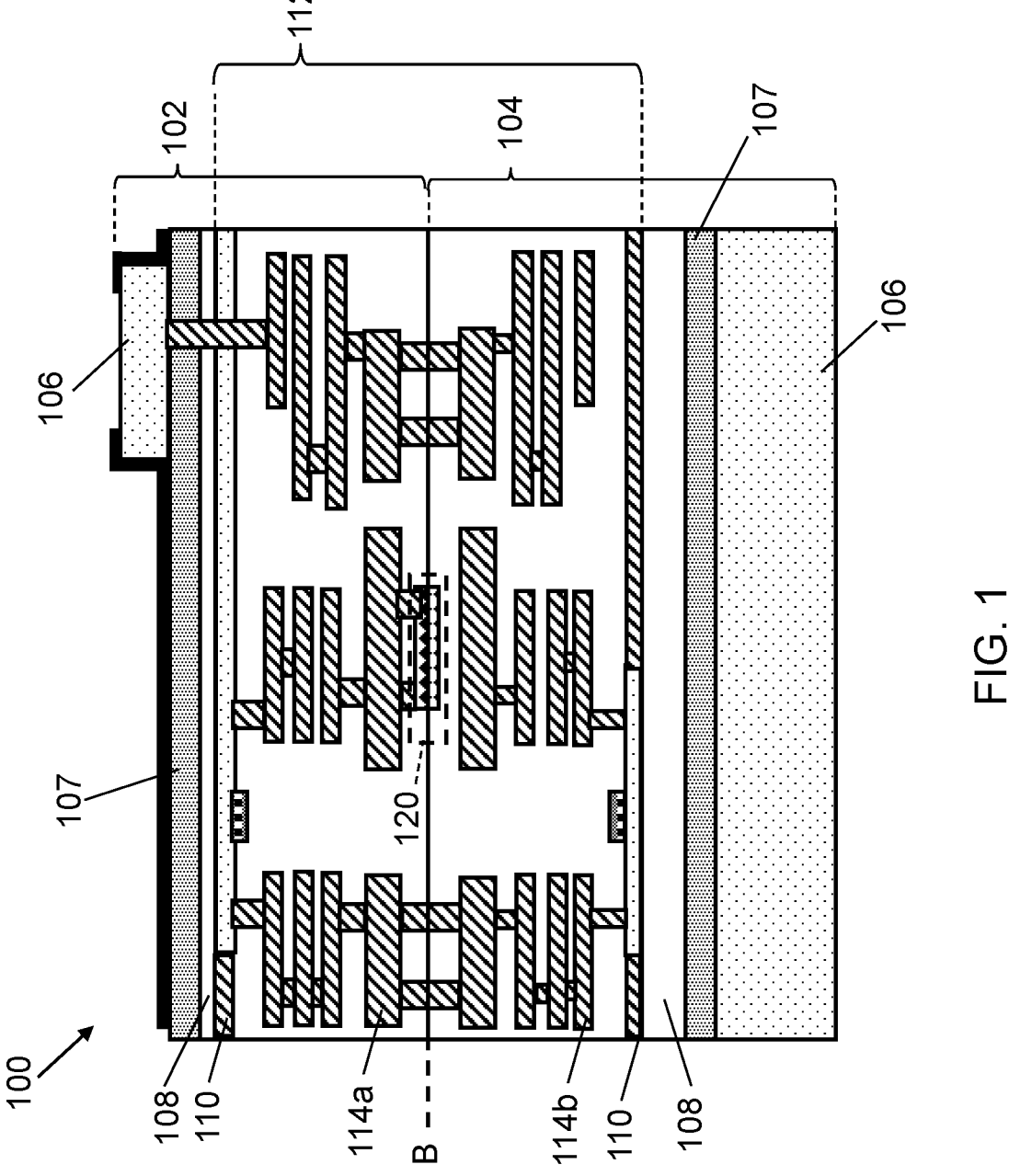
FIG. 1 shows a cross-sectional view of a device with a passive component traversing multiple semiconductor chips according to embodiments of a disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a method and system to fabricate a passive component traversing multiple semiconductor chips. More specifically, structures of the disclosure may include passive devices such as inductors, transformers, waveguides, capacitors, resistors, memory cells, other back end of line (BEOL) components, and/or any currently known or later developed component configured for operating when electrically driven by one or more distinct interconnected components. In the example of an inductor, i.e., a device to impede increasing or decreasing currents in an electric circuit, the inductor will have no effect on the circuit unless externally driven by a power supply. Methods and systems of the disclosure are operable to fabricate different portions of a passive component in different semiconductor chips, and account for the position of such passive components when simulating a product for manufacture. A structure according to the disclosure may include a plurality of stacked semiconductor chips including a first chip coupled to a second chip through an interface. A passive component traverses the interface between the first chip and the second chip of the plurality of stacked semiconductor chips. The passive component includes a first portion within the first chip and a second portion within the second chip.

Embodiments of the disclosure may operate by generating a three-dimensional model of a passive component traversing a plurality of stacked semiconductor chips. The three-dimensional model includes a first portion of the passive component in a first chip. The first portion may include all ports for the passive component, i.e., all connections between the passive component and interconnected portions. It is emphasized that even where the passive component is structured to include ports that are not within the first chip, the three-dimensional model can include all of such ports in the first portion of the passive component. Thus, the first portion of the three-dimensional is configured to simulate electrical operation of the passive component as though it were simply a part of the first chip. The three-dimensional model includes a second portion of the passive component in the second chip. The second portion of the passive component may not include any ports for the passive component, and in fact may include one or more vacancies to intentionally omit portions of the passive component that are already modeled in the first portion. The method may include fabricating the passive component based on the generated three-dimensional model and, in some cases, may additionally include simulating an operation of the passive component solely via the first portion of the three-dimensional model.

FIG. 1 depicts a cross-sectional view of a device structure (simply "structure" hereafter) 100 including multiple stacked semiconductor chips, e.g., a first semiconductor chip (simply "first chip" hereafter) 102 mounted on a second semiconductor chip (simply "second chip" hereafter) 104 along an interface B. Each chip 102, 104 may include a substrate 106 (e.g., silicon (Si), silicon germanium (SiGe) and/or any other currently known or later developed semiconductor material) with a plurality of additional layers formed thereon. Although substrate 106 is depicted as being only in first chip 102, second chip 104 also may include substrate 106 in some implementations. Substrate(s) 106 optionally may be vertically adjacent a resistive semiconductor material 107 (e.g., trap rich semiconductor and/or other similar materials) to control the electrical conductivity of other materials on or within chip(s) 102, 104.

To join chips 102, 104 together along interface B, each chip 102, 104 may have an opposing vertical orientation as depicted in FIG. 1. Each chip 102, 104 additionally may include an insulator layer 108 (e.g., a layer of oxide, nitride, and/or other suitable insulative material(s)) on substrate 106. Insulator layer(s) 108 may be provided, e.g., to provide a semiconductor on insulator (SOI) structure in each chip 102, 104 or to electrically separate substrate 106 from various conductive components formed thereon. A device layer 110 includes various active components, e.g., transistors, logic circuits, etc., for implementing various functions of a product. The details of device layer 110 will vary from product to product as well understood in the art. To interconnect various structures within each device layer 110 of chips 102, 104, a back end of line (BEOL) region 112 may include a set of conductors 114 (separately identified as conductors 114*a* to denote those in first chip 102 and conductors 114*b* to denote those in second chip 104), e.g., conductive wires to define horizontal connections and vertically extending vias to define vertical connections.

Figure 2:
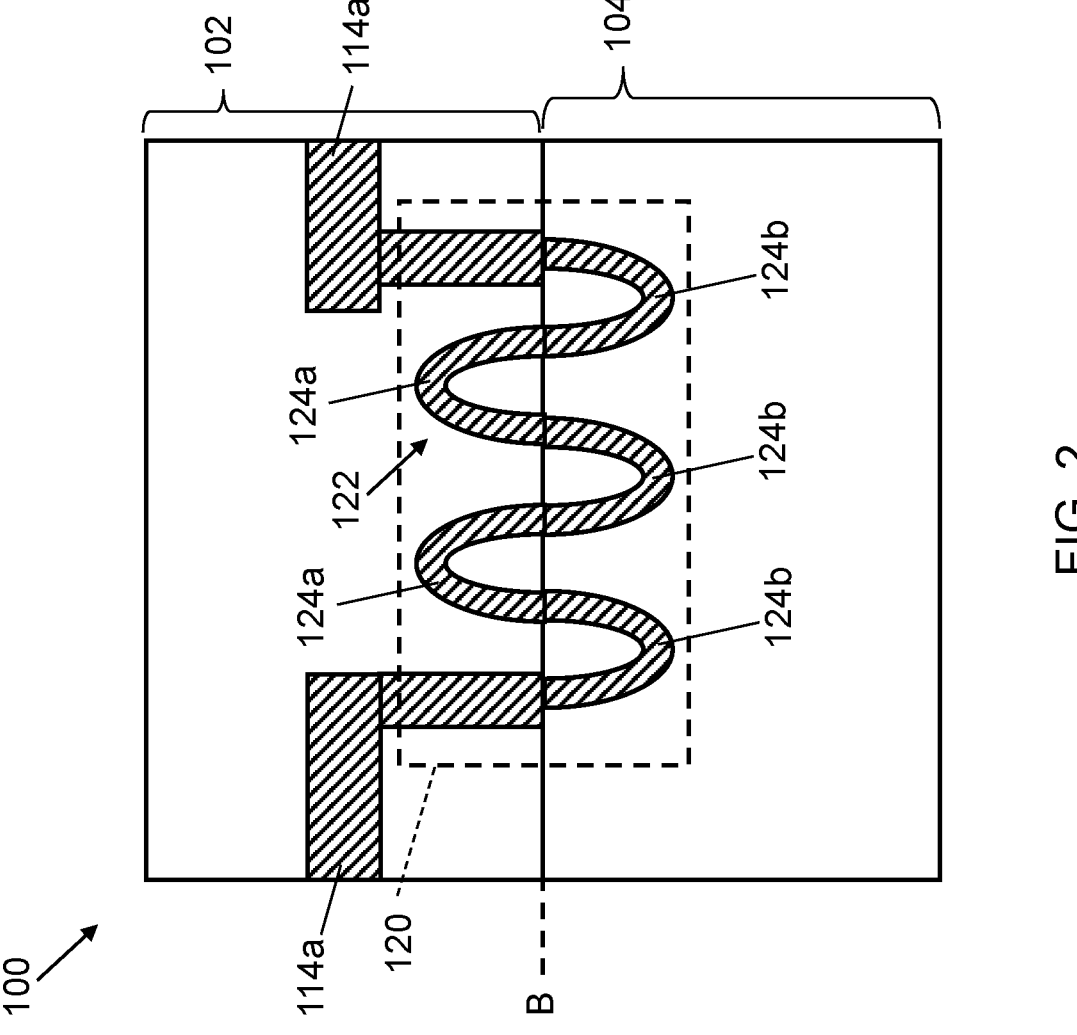
FIG. 2 shows an expanded cross-sectional view of a passive component traversing multiple semiconductor chips according to embodiments of the disclosure.

Referring to FIGS. 1 and 2 together, structure 100 may include one or more passive components 120 traversing chips 102, 104. FIG. 2 provides an expanded cross-sectional view of passive component 120 within structure 100. In this context, the term "traversing" means that some portions of passive component 120 are within first chip 102 and other portions of passive component 120 are within second chip 104, but passive component 120 nonetheless may be a continuous unitary structure. Thus, passive components 120 "traversing" stacked chips (e.g., first chip 102 and second chip 104) will operate only after the chips are stacked and bonded together. Any passive component(s) 120 that remain electrically operable without one chip being joined to the other do not "traverse" the interface between stacked semiconductor chips, i.e., they are actually two or more distinct passive components. Passive component 120 may include multiple ports, i.e., one or more electrical physical connections or terminals from passive component 120 to conductors 114 within chip 102 or chip 104, where applicable. Passive component 120 may include a two-terminal device as shown by example in FIG. 1, or passive component 120 may have any number of terminals and/or may be an assembly of multiple passive devices. In the case of an assembly, passive component 120 may have individual portions positioned entirely within only one chip 102, 104 but passive component 120 itself may traverse multiple chips 102, 104. As noted herein, an assembly of devices defining one passive component 120 is only considered to "traverse" multiple chips in the case where such an assembly is electrically inoperable unless the chips are joined together.

As shown specifically in FIG. 2, passive component 120 is illustrated as an inductor 122 to further illustrate how portions of one passive component 120 may be located in first chip 102 and second chip 104. Inductor 122 may include a loop of conductive material configured to create a magnetic field to oppose increasing and decreasing electric currents within the span of inductor 122. Inductor 122 may include multiple turns 124a, 124b, each being a portion of inductor 122 to define a conductive loop within structure 100. It is emphasized turns 124a, 124b of inductor 122 are also oriented to coil into and out of the plane of the page to define multiple loops of conductive material, although this not explicitly shown in FIG. 2. Inductor 122 may include turns 124a within chip 102, alternating with turns 124b within chip 104. Despite portions of inductor 122 being formed in different chips 102, 104, all portions of inductor 122 (including turns 124a, 124b) are part of one passive component 120. Moreover, passive component 120 may be connected only to conductors 114 of one chip (e.g., conductors 114a of chip 102 in the example of FIG. 2 et seq.). Embodiments of the disclosure enable portions one passive component 120 to be formed in respective chips 102, 104, simulated as though it were part of only one chip 102, 104, and fabricated by joining of first chip 102 to second chip 104.

Figures 3A, 3B, 3C:
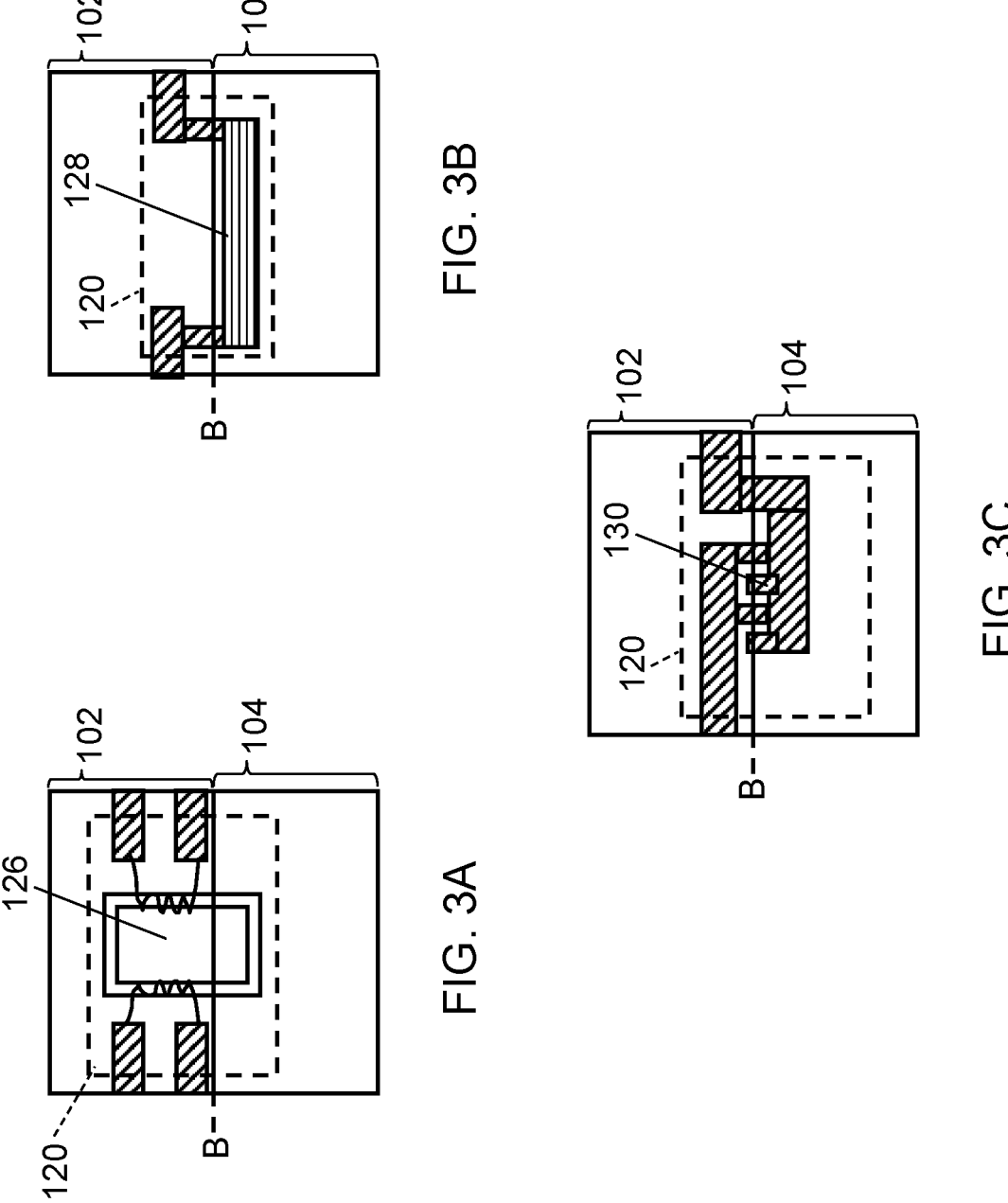
FIGS. 3A-3E show cross-sectional views illustrating examples of other passive components traversing multiple semiconductor chips according to embodiments of the disclosure.
Figure 3E:
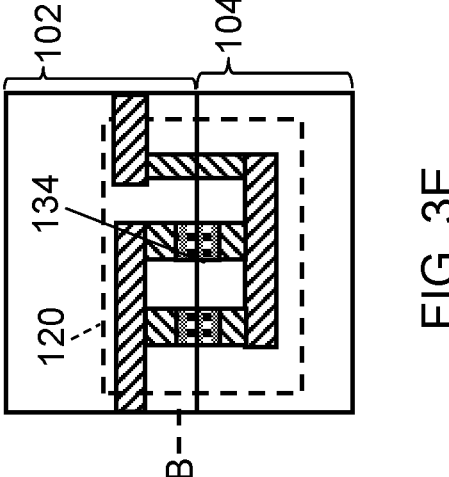
Figure 3D:
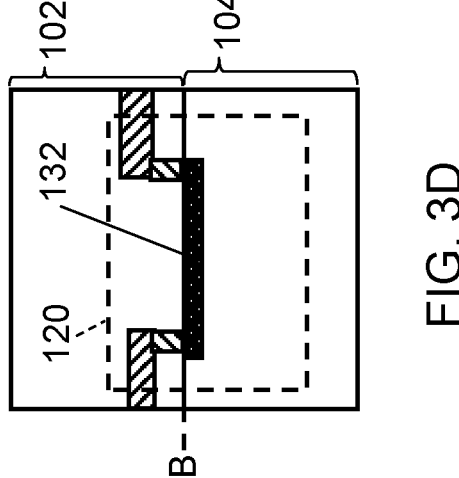

Referring to FIGS. 3A-3E, passive component 120 may be implemented as any currently known or later developed back end of line (BEOL) component, and further implementations of passive component 120 are discussed for the sake of example. It is understood that structure 100 according to the disclosure may include passive component(s) 120 according to any one or more of the various examples discussed herein, as well as any other currently known or later developed passive component capable of being formed within and/or traversing multiple chips 102, 104. In FIG. 3A, a transformer 126 traverses interface B between chips 102, 104. Some portions of transformer 126 may be fabricated within first chip 102 and others may be fabricated within second chip 104, but transformer 126 nonetheless defines one passive component 120 traversing chips 102, 104. FIGS. 3B-3E similarly provide further examples of a waveguide 128 (FIG. 3B), a capacitor 130 (FIG. 3C), a resistor 132 (FIG. 3D), and a memory cell 134 (FIG. 3E) capable of traversing interface B between chips 102, 104. Regarding memory cell 134, a magnetic random access memory (MRAM) memory structure is shown including layers of conductive material with a magnetic material and magnetic tunnel junction (MTJ) therebetween, but it is understood that any currently known or later developed memory structure could be implemented to provide memory cell 134. Such structures similarly may traverse interface B between chips 102, 104. Moreover, it is understood that any of the various examples discussed herein regarding FIG. 2, FIGS. 3A-3E, and/or any other currently known or later developed passive component 120 may be implemented together and across interface B between chips 102, 104 in one structure 100 (FIGS. 1, 3). Passive component 120 is illustrated as inductor 122 (FIG. 2) elsewhere herein as an example, but it is understood that any type of passive component 120 may be substituted without departing from the principles of the disclosure.

Figure 4:
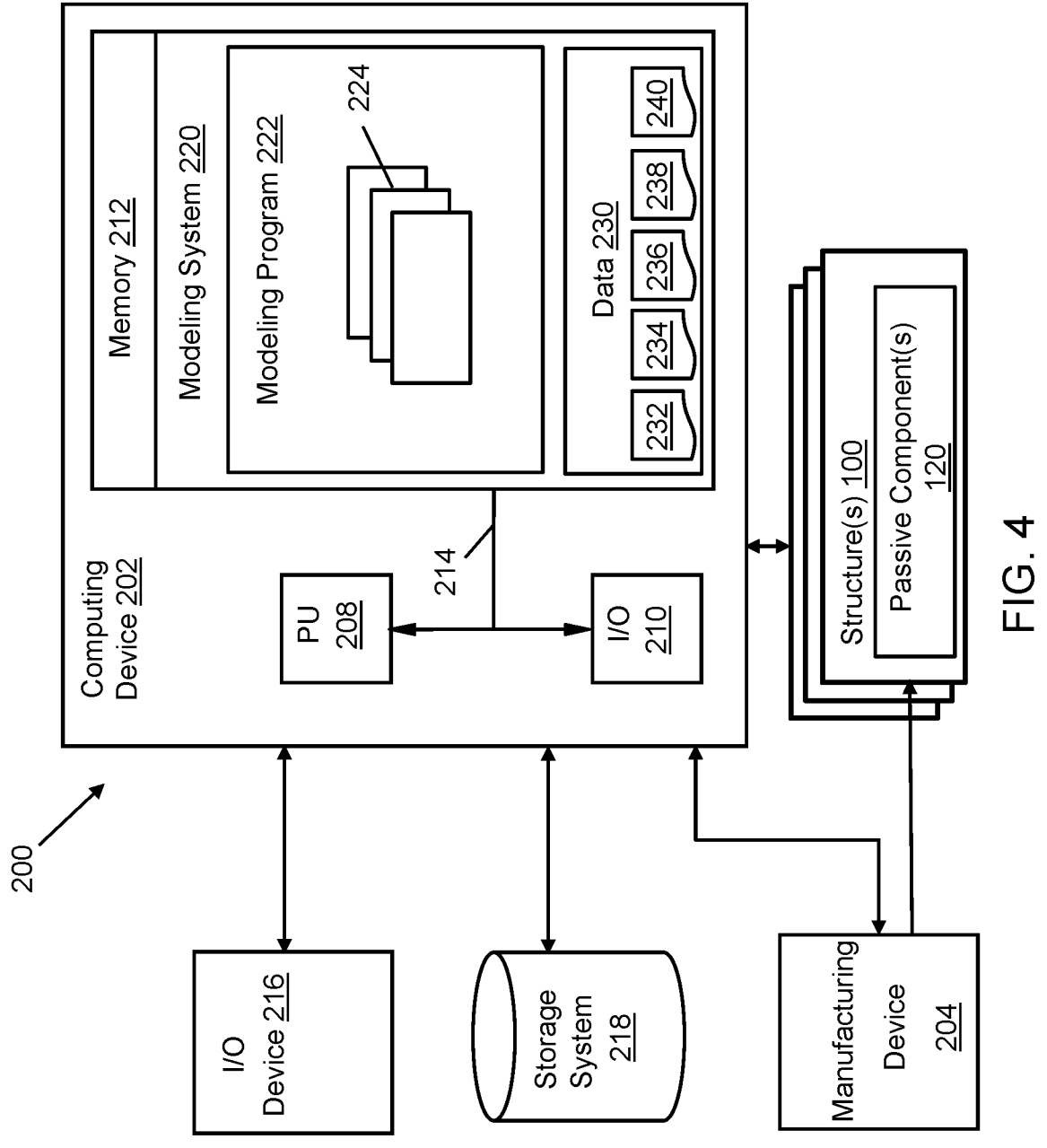
FIG. 4 shows an illustrative environment for implementing a method, system, or program product according to embodiments of the disclosure.

Referring to FIG. 4, an illustrative environment 200 for implementing systems and methods of the disclosure using one or more computing devices 202 is described. Environment 200 may include a computing device 202, which may be integrated within multiple devices or simply may be embodied as any device having a currently known or later developed computing infrastructure thereon. Computing device 202, where applicable, may be in communication with a manufacturing device 204, i.e., any currently known or later developed manufacturing hardware configured to fabricate structure 100 (FIGS. 1, 2) and/or chips 102, 104 (FIGS. 1, 2). Manufacturing device 204 itself also may be implemented on, and/or may be coupled to computing devices having a similar hardware architecture to computing device 202, with various distinct hardware and/or software features for implementing respective functions. In further implementations, computing device 202 may be a portion of manufacturing device 204.

As discussed herein, computing device(s) 202 and manufacturing device 204 may cooperate with each other and/or other components to model and manufacture structure(s) 100 with passive component(s) 120 traversing multiple chips 102, 104. Computing device 202 and/or manufacturing device 204 may include a processor unit (PU) 208, an input/output (I/O) interface 210, a memory 212, and a bus 214. Further, computing device 202 is shown in communication with an external I/O device 216 and a storage system 218. The external I/O device 216 may be embodied as any component allowing user interaction with the computing device 202. A modeling system 220, i.e., a hardware or software implemented component to control and/or otherwise affect device fabrication, may be included wholly or partially within memory 212 of computing device 202.

Modeling system 220 can execute a modeling program 222, which in turn can include various modules 224, e.g., one or more software components configured to perform different actions, including without limitation: a calculator, a determinator, a comparator, etc. Modules 224 can implement any currently known or later developed analysis technique for modeling structure(s) 100 and/or interacting with manufacturing device 204 or other components, e.g., by cooperating with manufacturing device 204 such that models generated according to the disclosure may be used to fabricate and/or modify the fabrication of structure(s) 100 to include passive component(s) 120 in desired positions.

Modules 224 of modeling system 220 can use calculations, look up tables, and similar tools stored in memory 212 for processing, analyzing, and operating on data to perform their respective functions. In general, the PU 208 can execute computer program code, such as modeling program 222, which can be stored in memory 212 and/or storage system 218. Memory 212 and/or storage system 218 thus may represent any suitable memory or storage device (internal, external, cloud-based, and so on) on and/or associated with modeling system 220 and may be configured to be accessed by a user of modeling system 220 for providing communication capabilities and/or information to the user, e.g., via I/O interface 210 and/or various I/O controllers. While executing computer program code, PU 208 can read and/or write data to or from memory 212, storage system 218, and/or I/O interface 210. Bus 214 can provide a communications link between each of the components in computing device 202. I/O device 216 can comprise any device that enables a user to interact with computing device 202 or any device that enables computing device 202 to communicate with the components described herein and/or other computing devices. I/O device 216 (including but not limited to keyboards, displays, pointing devices, etc.) can be coupled to computing device 202 and/or manufacturing device 204, etc., either directly or through intervening I/O controllers (not shown).

Memory 212 can include a cache of data 230 organized for reference or use by modeling system 220. As discussed elsewhere herein, computing device 202 can send, receive, and/or rely various types of data 230, including models of structure(s) 100 and sub-models and/or portions of models representing structure(s) 100. Data 230 thus may be classified into multiple fields and, where desired, sub-fields within each field of data 230. The data 230 may be provided to and/or from manufacturing device 204, other computing devices, etc., via I/O device 216. In some cases, these communication features may also be contained within memory 212 of computing device 202.

Data 230 can optionally be organized into a group of fields. In some cases, data 230 may include various fields indicative of data used for modeling, modifying, and/or fabricating of structure(s) 100. For example, the data 230 may include one or more three-dimensional models 232, e.g., for representing all chips (e.g., first chip 102 (FIGS. 1, 2) and second chip 104 (FIGS. 1, 2)) making up a complete implementation of structure 100. Modeling program 222 may be operable to convert three-dimensional model(s) 232 into a first portion 234 representing first chip 102 and a second portion 236 representing second chip 104. As discussed elsewhere herein, a passive component model 238, including all ports for simulating the operation of structure(s) 100 may be integrated into first portion 234 without being included within second portion 236. Additionally, data 230 may include a set of alignment markers 240 for identifying the location of passive component(s) 120 within structure 100. Alignment marker(s) 240 may be appear only in one portion (e.g., first portion 234) of three-dimensional model 232, such that the other portion(s) (e.g., second portion 236) does not include alignment marker(s) 240. It is further understood that additional portions of three-dimensional model 232, including data fields therefor, may be included in cases where structure 100 includes more than two stacked chips.

Each type of data 230, however embodied, may be accessible to modeling program 222. The data 230 may be mixed and parsed using the modeling program 222 as it interfaces with manufacturing device 204, e.g., via the Internet, to store various models, manufacturing instructions, etc. Such information may remain available to modeling program 222 as data 230, which may be used for reference to model and/or modify additional structure(s) 100. The modeling program 222 thus may output data to be interpreted by manufacturing device 204 and may send and receive data relating to other structures 100 and/or portions thereof.

Figure 5:
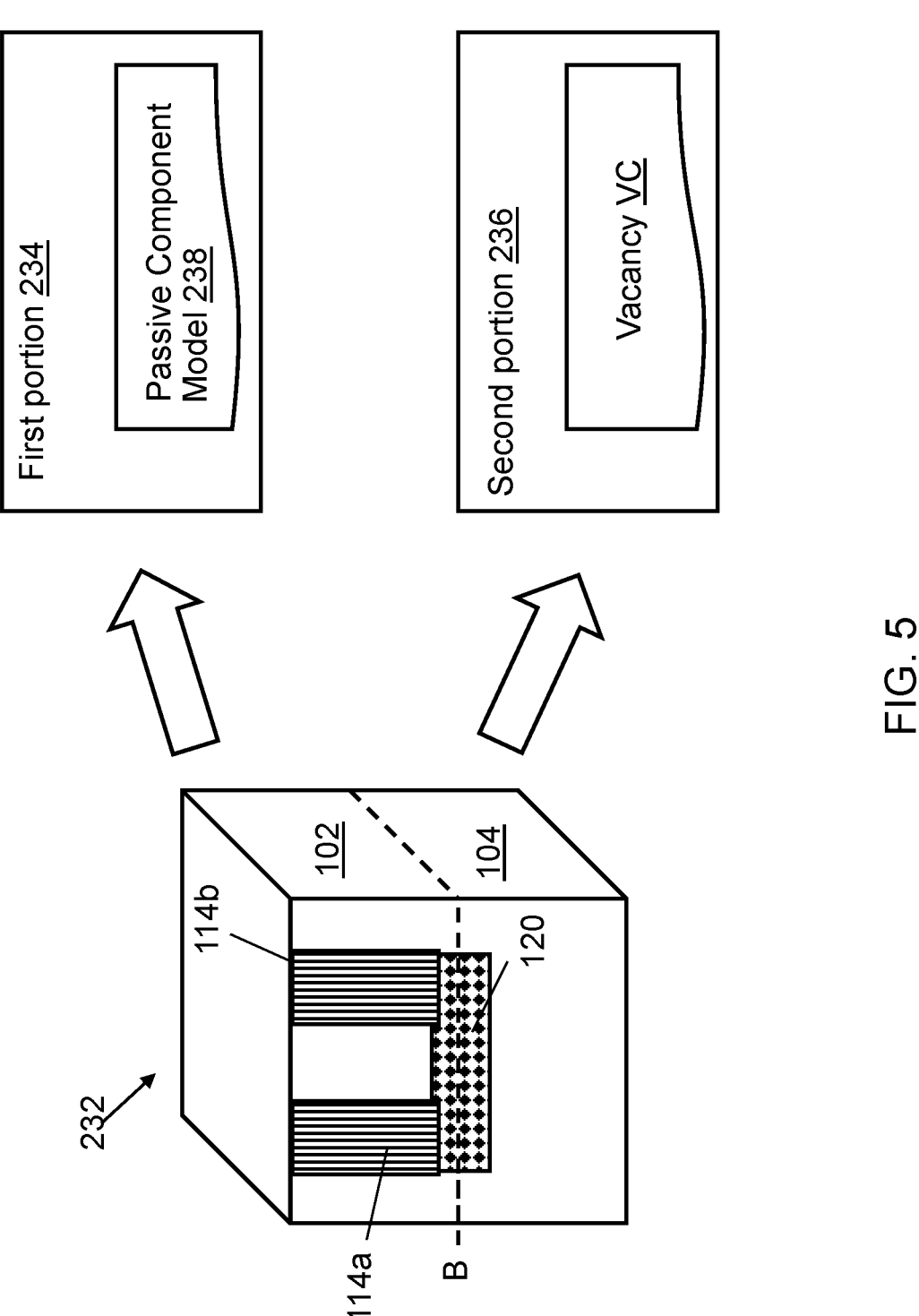
FIG. 5 shows an illustrative data flow diagram of generating a three-dimensional model including a first portion within a first chip and a second portion within a second chip according to embodiments of the disclosure.

Referring to FIGS. 4 and 5 together, computing device 202 is operable to generate one or more three-dimensional models 232 representing structure 100 and portions thereof. Modeling program 222 of computing device 202 may generate three-dimensional model(s) for structure(s) 100 by any currently known or later developed technique for creating a virtual model of a physical structure, e.g., converting an image or product specification of structure(s) 100 into a virtual three-dimensional representation of physical features within structure(s) 100, generating three-dimensional model 232 based on a product specification or other data for structure(s) 100 that have not yet been manufactured, manually generating three-dimensional model 232 with the aid of automated or partly-automated visual modeling software, etc.

Three-dimensional model 232 may be structured to include first chip 102 stacked on second chip 104, in which conductors 114a, 114b are included where applicable within chips 102, 104. Three-dimensional model 232 may also depict interface B where first chip 102 meets second chip 104. Three-dimensional model 232 may include passive component(s) 120 traversing interface B between chips 102, 104. Modeling program 222 may automatically (e.g., with the aid of three-dimensional modeling and converting software modules) generate a set of partial models including first portion 234 representing various components within first chip 102 and a second portion 236 representing various component within second chip 104. As discussed elsewhere herein, first portion 234 may include passive component model 238 therein but second portion 236 may not include passive component model 238 (i.e., it may include vacancies VC where passive component model(s) 238 would otherwise be included).

Figure 6:
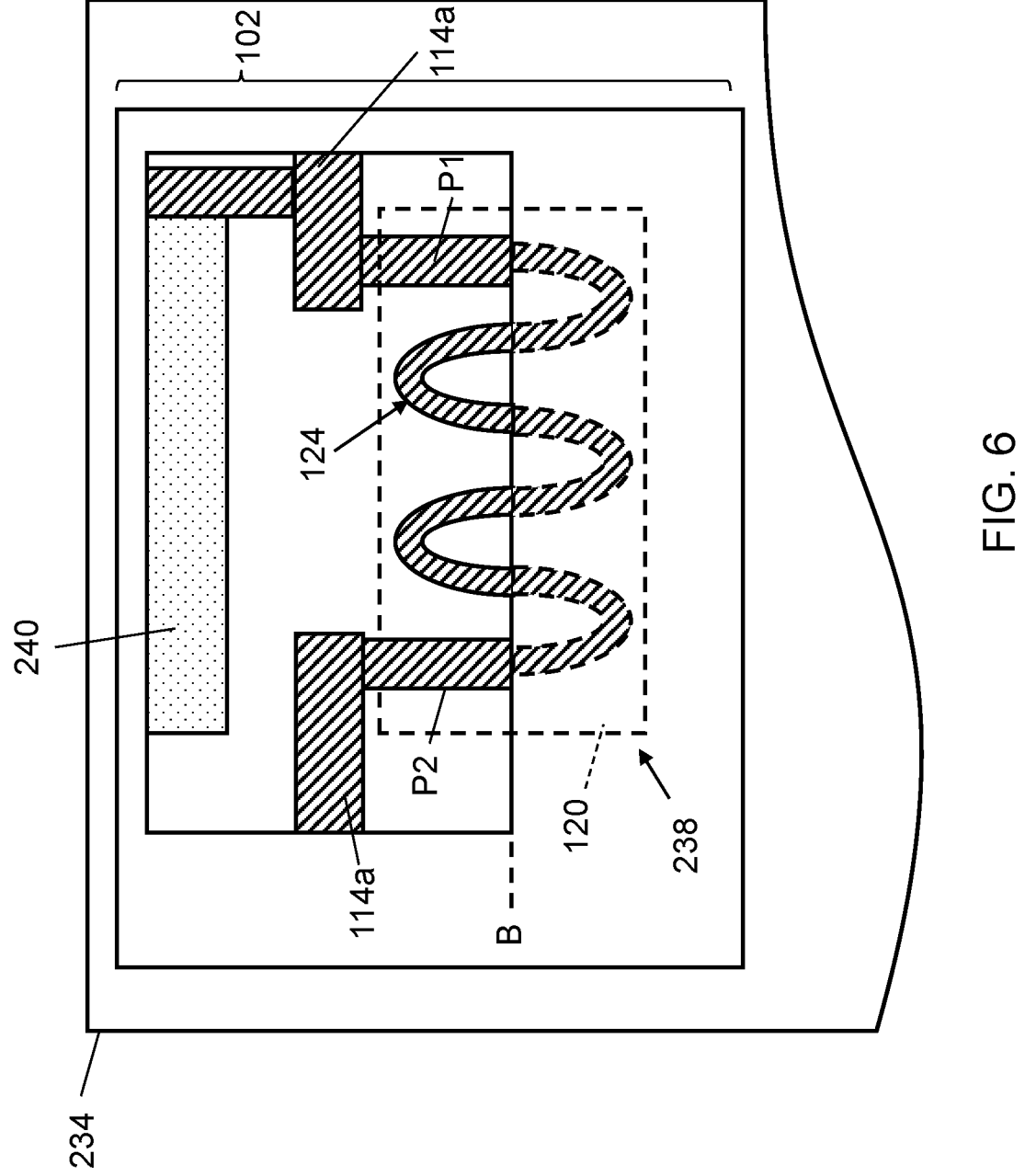
FIG. 6 shows a cross-sectional view of an example of a first portion of a three-dimensional model according to embodiments of the disclosure.

Referring to FIGS. 5 and 6, an example diagram of first portion 234 is shown in an example where passive component 120 includes inductor 122 (FIG. 6). Although inductor 122 may traverse interface B and thus is only partially within first chip 102, as discussed elsewhere herein, first portion 234 may include a complete model of passive component 120 (it may include portions of passive component 120 located in first chip 102 and outside first chip 102), as well as a set of ports P1, P2 for connecting of passive component 120 to conductors 114a within first chip 102. Although passive component 120 is located partially in second chip 104 as discussed herein, passive component model 238 includes all areas of passive component 120 that would be formed within second chip 104 (i.e., those shown in dashed lines). Thus, first portion 234 is capable of simulating the electrical properties of passive component 120 via its connections to other components through ports P1, P2. First portion 234 may include an alignment marker 240 for indicating, e.g., the location of passive component 120 within first chip 102. Alignment marker 240 may be physically present in the manufactured form of structure 100, e.g., alignment marker 240 may include one or more layers of electrically inactive and radiation-reflective material for identifying the location of passive component(s) 120. Alignment marker(s) 240 may be any substance capable of reflecting light transmitted within portions of first chip 102. Alignment marker 240 may be any substance having a refractive index of, e.g., at least approximately 1.50. Such materials may include metals, e.g., copper (Cu), aluminum (Al), cobalt (Co), nickel (Ni), tungsten (Ti), gold (Au), silver (Ag), platinum (Pt), zinc (Zn), etc. Alignment marker 240 may also include metallic compounds or composite substances, e.g., titanium nitride (TiN), vanadium oxide (VnO$_2$), titanium dioxide (TiO$_2$), indium oxide (In$_2$O$_3$), silicide materials, metal alloys, etc. Further materials suitable for use as and/or within alignment marker 240 may include, e.g., metalloids such as germanium (Ge), and/or non-metals such as Si when used with waveguides and/or grating structures that are formed of materials other than Si (e.g., silicon nitride (SiN)).

Figure 7:
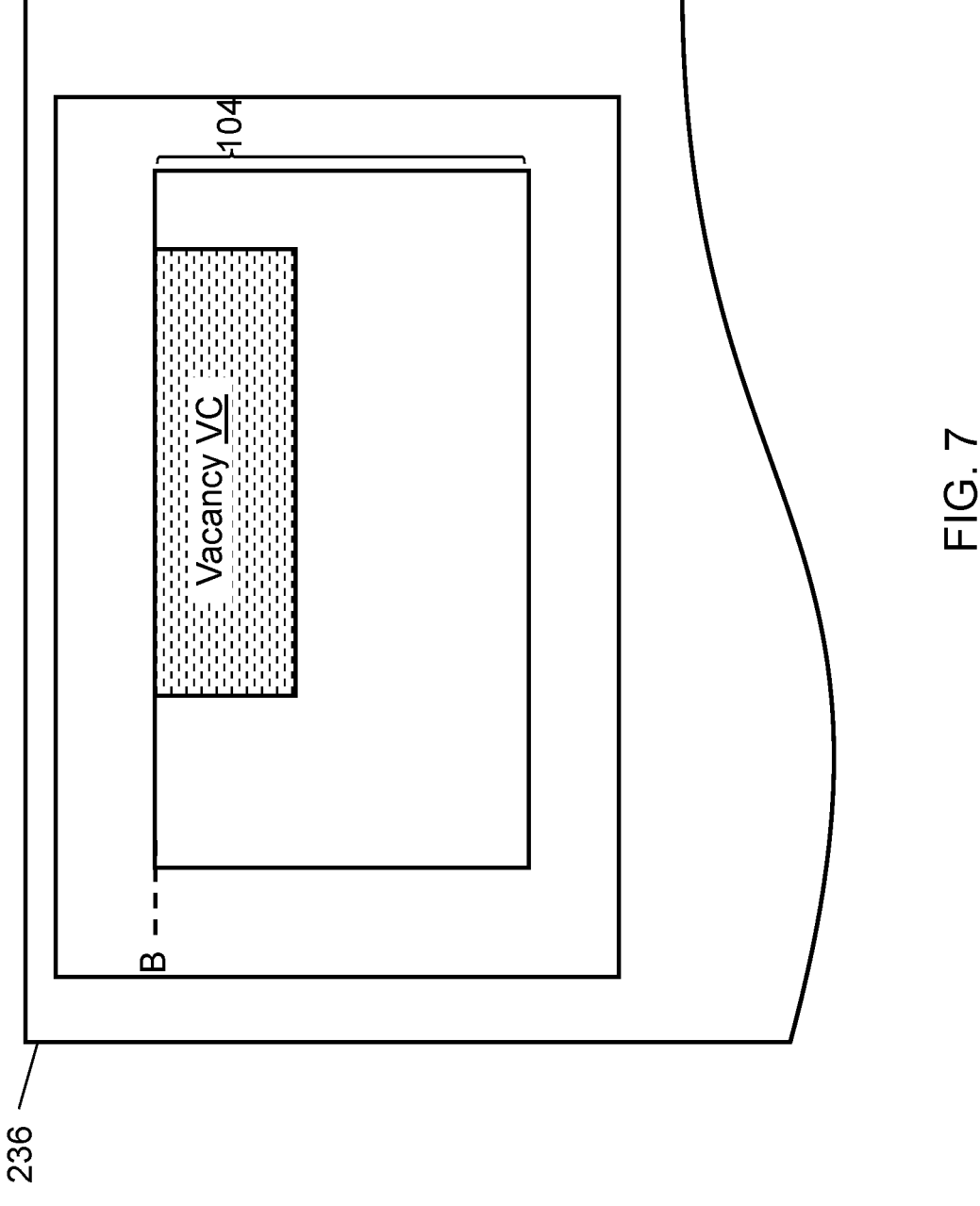
FIG. 7 shows a cross-sectional view of an example of a second portion of a three-dimensional model according to embodiments of the disclosure.
Figure 8:
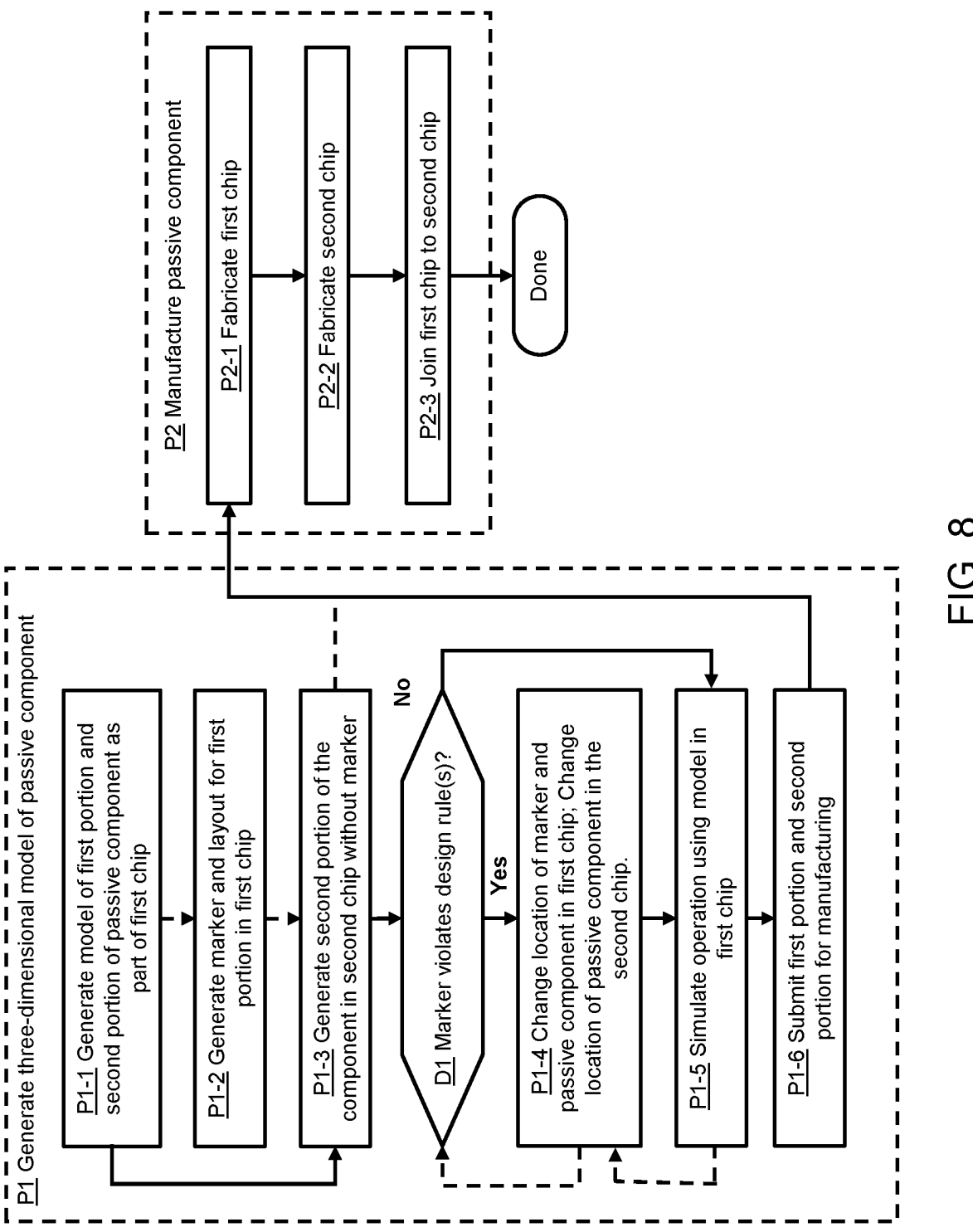
FIG. 8 shows an illustrative flow diagram for implementing an operational methodology according to embodiments of the disclosure.

Referring now to FIGS. 5 and 7, second portion 236 of three-dimensional model 232 (FIG. 5) may include a vacancy VC where passive component 120 would otherwise be located in second chip 104 to allow inspection of component placement, conformity to layout rules, etc., for structure 100. However, second portion 236 may differ from first portion 234 by not being configured for simulating the operational features of passive component 120. Although portions of passive component 120 may be located within second chip 104, partial passive component 120B within second portion 236 may deliberately omit passive component model 238, ports P1, P2, and alignment markers 240. Vacancy VC may be provided solely to model and adjust the position of where passive component(s) 120 would appear in second chip 104, so that passive component 120 may be electrically simulated solely via first portion 234. Second portion 236 thus may be configured for visual and spatial analysis of components within second chip 104, whereas first portion 234 of three-dimensional model 232 may enable such analysis of first chip 102 in addition to operational features of any components wholly or partially within second chip 104.

Turning to FIGS. 4 and 6-8, embodiments of the disclosure provide a method and system to fabricate structure 100 in which passive component 120 traverses multiple semiconductor chips (e.g., first chip 102 and second chip 104). Methods of the disclosure may yield structure(s) 100 including passive component(s) 120 traversing first chip 102 and second chip 104, and/or may modify an initial design for a structure to include passive component(s) 120 traversing chips 102, 104. In either scenario, the operational methodology can be implemented substantially as described herein.

Process P1 includes generating three-dimensional model 232 of passive component 120 and may include multiple sub-processes P1-1, P1-2, P1-3, D1, P1-4, P1-5, and/or P1-6 for analyzing and modifying a specification for structure 100 before it is manufactured. Process P1-1 may include causing modules 224 of modeling program 222 to generate a model of first portion 234. As discussed herein, first portion 234 may include passive component model 238 with all ports (P1, P2) for passive component(s) 120 located within first chip 102, in addition to any portions of passive component 120 that are actually within second chip 104. First portion 234 may be structured to simulate the electrical operation of passive component 120 as part of first chip 102, e.g., by including all of passive component(s) 120 and requisite ports P1, P2 within first portion 234, simulating the electrical behavior of any other components to which passive component 120 connects. In cases where alignment marker 240 is to be included in structure 100, embodiments of the disclosure may include process P1 of modules 224 placing alignment marker(s) 240 of three-dimensional model 232 within first portion 234 over passive component 120 in first chip 102. Including alignment marker(s) 240 within first portion 234 may allow modeling system 220 to analyze whether the location of certain passive components 120 complies with design rules for structure 100, e.g., as set forth in a design rule check (DRC) operation before manufacture.

Further processing may include modules 224 of modeling program 222 generating a model of second portion 236 of three-dimensional model 232. Second portion 236, in contrast to first portion 234, may include only vacancy VC (FIG. 8) of passive component 120, in addition to any other components located wholly within second chip 104. Additionally, second portion 236 may not include any ports for passive component 120 because such ports are located only in first chip 102 as discussed elsewhere herein.

In some implementations, methods of the disclosure may immediately proceed to process P2 of manufacturing passive component 120 after process P1-3 concludes (i.e., as shown by corresponding dashed lines). In other implementations, process P1 may include further sub-processes to analyze and/or modify three-dimensional model 232 based on certain features of first portion 234 and/or second portion 236, modules 224 may determine in decision D1 whether one or more alignment markers 240 violate any predetermined design rules for structure 100. Design rules considered in decision D1 may be stored, e.g., in memory 212 of design system 220, elsewhere in memory 212 of computing device 202, within manufacturing device(s) 204 in communication with computing device 202, and/or other components (e.g., storage system 218) in communication with modeling system 220.

In cases where the location of alignment marker 240 violates a design rule for structure 100 (e.g., it may have less than a minimum separation distance to an adjacent component, it may be in a prohibited position, it may be of greater than a maximum surface area, etc.), i.e., "Yes" at decision D1, modules 224 of design system 220 may implement process P1-4 of repositioning passive component model 238 and alignment marker 240 within first portion 234, and correspondingly changing the position of vacancy VC within second portion 236. Technical effects of process P1-4 may include, e.g., modifying three-dimensional model 232 and hence the eventual features of structure 100 at the time of manufacture. In cases where the location of alignment marker 240 does not violate a design rule for structure 100, i.e., "No" at decision D1, the method instead may proceed directly to process P1-5. Process P1-5 otherwise may be implemented upon the conclusion of process P1-4. In further implementations, decision D1 may be repeated relative to the new location of alignment marker 240 after process P1-4 concludes.

In process P1-5, modules 224 may simulate the electrical operation of passive component 120 via passive component model 238 in first portion 234. As discussed elsewhere herein, first portion 234 may include all of passive component(s) 120 and all ports for coupling of passive component(s) 120 to other components. The simulating in process P1-5 may include, e.g., modules 224 of modeling system 220 applying simulated voltages, currents, etc., to corresponding nodes within first portion 234 of three-dimensional model 232 to simulate an electrical response for passive component 120. The simulating may be implemented using any currently known or later developed tool (including those implemented via hardware or software) for simulating the electrical behavior of a device. After simulating the electrical operation of passive component 120 via first portion 234, the method may include, e.g., re-implementing of process P1-4 to change the location of passive component 120 and alignment marker 240 (where applicable) in first portion 234 and second portion 236 of three-dimensional model 232, e.g., to correct errors or other problems detected when simulating the operation of passive component 120. Otherwise, the method may proceed to process P1-6 in which modeling system 220 finalizes and submits three-dimensional model 232, including portions 234, 236 thereof, for manufacture (e.g., they may be transmitted as data to manufacturing device(s) 204).

Process P2 may be implemented via manufacturing device 204 at the conclusion of process P1 and may include fabricating structure 100 and passive component 120 therein. Similar to process P1, the fabricating of passive component 120 may include several sub-processes P2-1, P2-2, P2-3 to fabricate structure 100 via techniques suitable for a multi-chip device. For example, process P2-1 may include fabricating first chip 102, and process P2-2 may include fabricating second chip 104. The fabricating in processes P2-1, P2-2 may be based on three-dimensional model 232 rather than portions 234, 236 discussed herein, e.g., such that part of passive component 120 is formed in first chip 102 and another part of passive component 120 is formed in second chip 104. Processes P2-1, P2-2 may be implemented in the opposite order, simultaneously, and/or in any other fashion suitable to a particular structure 100 specification or manufacturing device 204. Moreover, processes P2-1, P2-2 may be implemented on a modified version of three-dimensional model 232, e.g., due to changes in position of passive component 120 and/or other physical features modeled within first portion 234 or second portion 236 within three-dimensional model 232. Process P2-3 may include, e.g., joining first chip 102 to second chip 104 by any currently known or later developed technique such as wafer bonding. After process P2 concludes, structure 100 may be produced according to embodiments of the disclosure. As discussed elsewhere herein, structure 100 may include first chip 102 bonded to second chip 104 along interface B (FIG. 1), in which passive component 120 is located partially within first chip 102 and partially within second chip 104, thus traversing interface B.

Embodiments of the disclosure provide various technical and commercial advantages, examples of which are discussed herein. The disclosure provides structure 100 and related manufacturing techniques to provide a three-dimensional multi-chip device structure capable of electrically simulating passive component 120 via only one of the individual chips. Embodiments of the disclosure, additionally, reduce surface area constraints by enabling passive devices 120 to be formed within multiple chips 102, 104 by traversing an interface B between chips 102, 104. In some cases, embodiments of the disclosure may reduce the size of a chip by significant multiples (e.g., by half) while also adding new functionalities and features. Embodiments of the disclosure avoid technical disadvantages associated with conventional manufacturing techniques, e.g., by not requiring larger passive components (e.g., inductors) or additional mask levels.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/− 10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
a plurality of stacked semiconductor chips including a first chip coupled to a second chip through an interface; and
a passive component traversing the interface between the first chip and the second chip of the plurality of stacked semiconductor chips, wherein the passive component includes:
a first portion within the first chip and a second portion within the second chip, and
a set of ports coupling a set of conductors in the first chip to the passive component, wherein the set of ports is free of couplings to the second chip.

2. The structure of claim 1, further comprising an alignment marker for the passive component within the first chip, wherein the second chip does not include a corresponding alignment marker.

3. The structure of claim 1, wherein the passive component includes at least one of an inductor, a transformer, a waveguide, a capacitor, a resistor, or a memory cell.

4. The structure of claim 1, wherein the passive component includes at least one back end of line (BEOL) component.

5. A method comprising:

generating a three-dimensional model of a passive component traversing a plurality of stacked semiconductor chips, wherein the three-dimensional model includes:

a first portion of the passive component in a first chip, the first portion including all ports for the passive component and being configured to simulate electrical operation of the passive component as part of the first chip, and a second portion of the passive component in a second chip, wherein the second portion does not include any ports for the passive component; and fabricating the passive component based on the three-dimensional model.

6. The method of claim 5, wherein the first portion includes an alignment marker for the passive component wherein the second portion does not include a corresponding alignment marker.

7. The method of claim 6, further comprising changing a location of the alignment marker within the first portion based on whether the alignment marker violates a design rule for the first portion and the second portion in the three-dimensional model.

8. The method of claim 5, wherein the passive component includes at least one back end of line (BEOL) component.

9. The method of claim 5, wherein the passive component includes at least one of an inductor, a transformer, a waveguide, a capacitor, a resistor, or a memory cell.

10. The method of claim 5, wherein fabricating the passive component includes:

fabricating the first chip and the second chip based on the three-dimensional model; and joining the first chip to the second chip based on the three-dimensional model.

11. The method of claim 10, wherein fabricating the passive component further includes:

fabricating a first portion of the passive component within the first chip; and fabricating a second portion of the passive component within the second chip.

12. The method of claim 5, further comprising:

simulating an operation of the passive component solely based on the first portion; and fabricating the passive component based on the simulated operation of the passive component.

13. The method of claim 12, further comprising modifying one of the first portion or the second portion of the three-dimensional model based on the simulated operation, wherein fabricating the passive component is based on the modified one of the first portion or the second portion.

14. A system comprising:

a computing device configured to generate a three-dimensional model of a passive component traversing a plurality of stacked semiconductor chips, wherein the three-dimensional model includes:

a first portion of the passive component in a first chip, the first portion including all ports for the passive component and being configured to simulate electrical operation of the passive component as part of the first chip, and a second portion of the passive component in a second chip, wherein the second portion does not include any ports for the passive component; and a manufacturing device in communication with the computing device and configured to fabricate the passive component based on the three-dimensional model.

15. The system of claim 14, wherein the computing device is further configured to simulate an operation of the passive component solely based on the first portion, and wherein the manufacturing device is further configured to fabricate the passive component based on the simulated operation of the passive component.

16. The system of claim 15, wherein the computing device is further configured to reposition an alignment marker for the passive component based on whether the alignment marker within the first portion of the three-dimensional model violates a design rule for the first portion or the second portion of the three-dimensional model.

17. The system of claim 15, wherein the computing device is further configured to modify to one of the first portion or the second portion of the three-dimensional model based on the simulated operation, wherein fabricating the passive component is based on the modified one of the first portion or the second portion.

18. The system of claim 14, wherein the passive component includes at least one back end of line (BEOL) component.

19. The system of claim 14, wherein the passive component includes at least one of an inductor, a transformer, a waveguide, a capacitor, a resistor, or a memory cell.

20. The system of claim 14, wherein the manufacturing device is further configured to fabricate an alignment marker for the passive component within the first chip, wherein the second chip does not include a corresponding alignment marker.

* * * * *